(12) United States Patent
Reisinger et al.

(10) Patent No.: US 6,215,140 B1
(45) Date of Patent: Apr. 10, 2001

(54) ELECTRICALLY PROGRAMMABLE NON-VOLATILE MEMORY CELL CONFIGURATION

(75) Inventors: Hans Reisinger, Grünwald; Martin Franosch, München; Herbert Schäfer, Höhenkirchen-Sieg. Brunn; Reinhard Stengl, Stadtbergen; Volker Lehmann; Gerrit Lange, both of München; Hermann Wendt, Grasbrunn, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/398,691

(22) Filed: Sep. 20, 1999

(30) Foreign Application Priority Data

Sep. 18, 1998 (DE) ................................. 198 42 883

(51) Int. Cl.[7] .................................................. H01L 29/72
(52) U.S. Cl. .......................... 257/296; 257/298; 257/302; 257/314; 257/321; 257/328; 257/330; 438/156; 438/243; 438/253; 438/259; 438/300; 438/542; 438/644
(58) Field of Search ....................... 257/296, 298, 257/302, 314, 321, 328, 330; 438/156, 243, 253, 259, 300, 694, 542

(56) References Cited

U.S. PATENT DOCUMENTS

| 4,677,742 | * | 7/1987 | Johnson ............................. 257/314 |
| 5,416,343 | | 5/1995 | Slotboom . |
| 5,441,907 | | 8/1995 | Sung . |
| 5,536,968 | | 7/1996 | Crafts . |

OTHER PUBLICATIONS

C. de Graaf et al.: "A Novel High–Density Low–Cost Diode Programmable Read Only Memory", XP–000753746.

* cited by examiner

*Primary Examiner*—Edward Wojciechowicz
(74) *Attorney, Agent, or Firm*—Herbert L. Lerner; Laurence A. Greenberg; Werner H. Stemer

(57) ABSTRACT

A memory cell configuration in a semiconductor substrate is proposed, in which the semiconductor substrate is of the first conductivity type. Trenches which run parallel to one another are incorporated in the semiconductor substrate, and first address lines run along the side walls of the trenches. Second address lines are formed on the semiconductor substrate, transversely with respect to the trenches. Semiconductor substrate regions, in which a diode and a dielectric whose conductivity can be changed are arranged, are located between the first address lines and the second address lines. A suitable current pulse can be used to produce a breakdown in the dielectric, with information thus being stored in the dielectric.

29 Claims, 12 Drawing Sheets

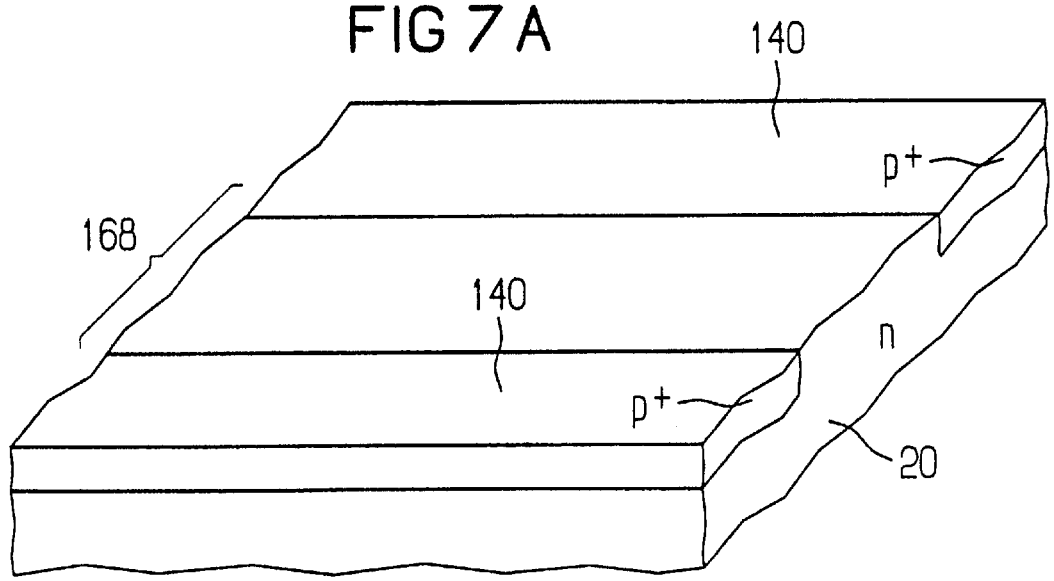
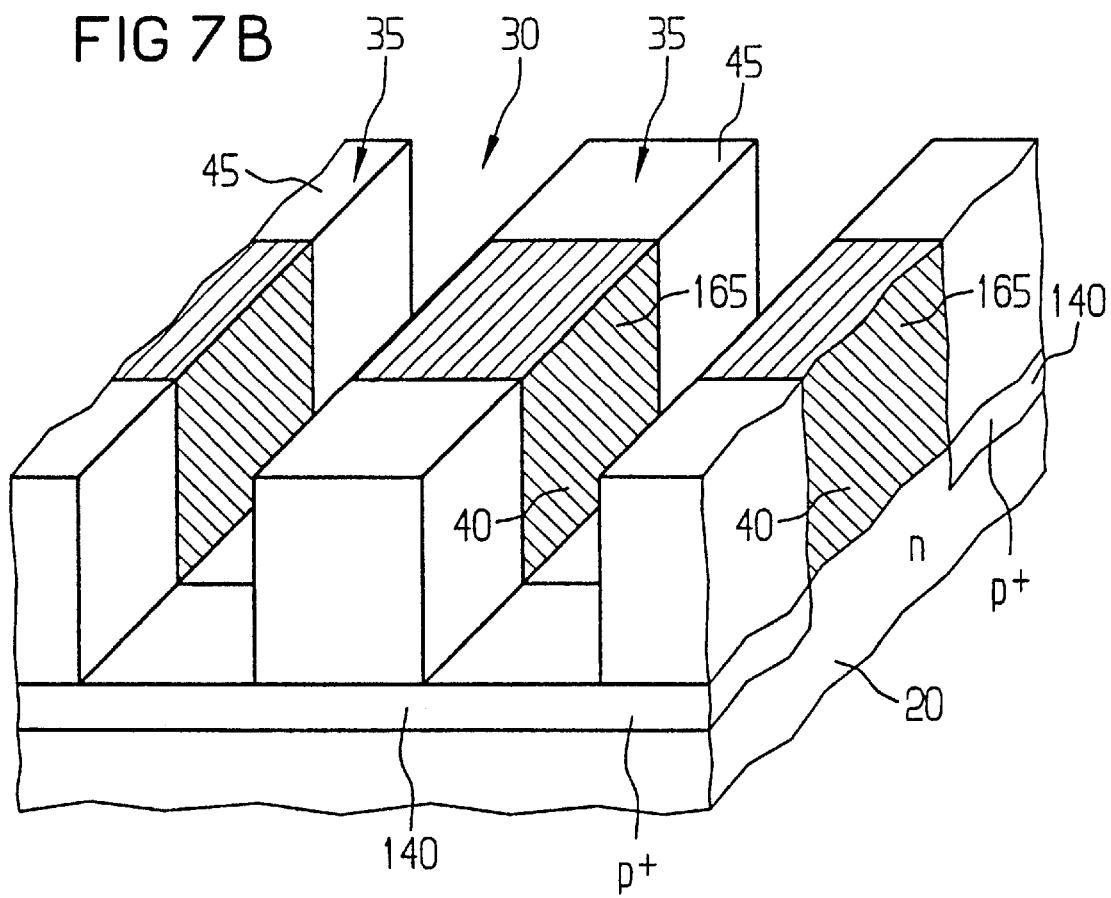

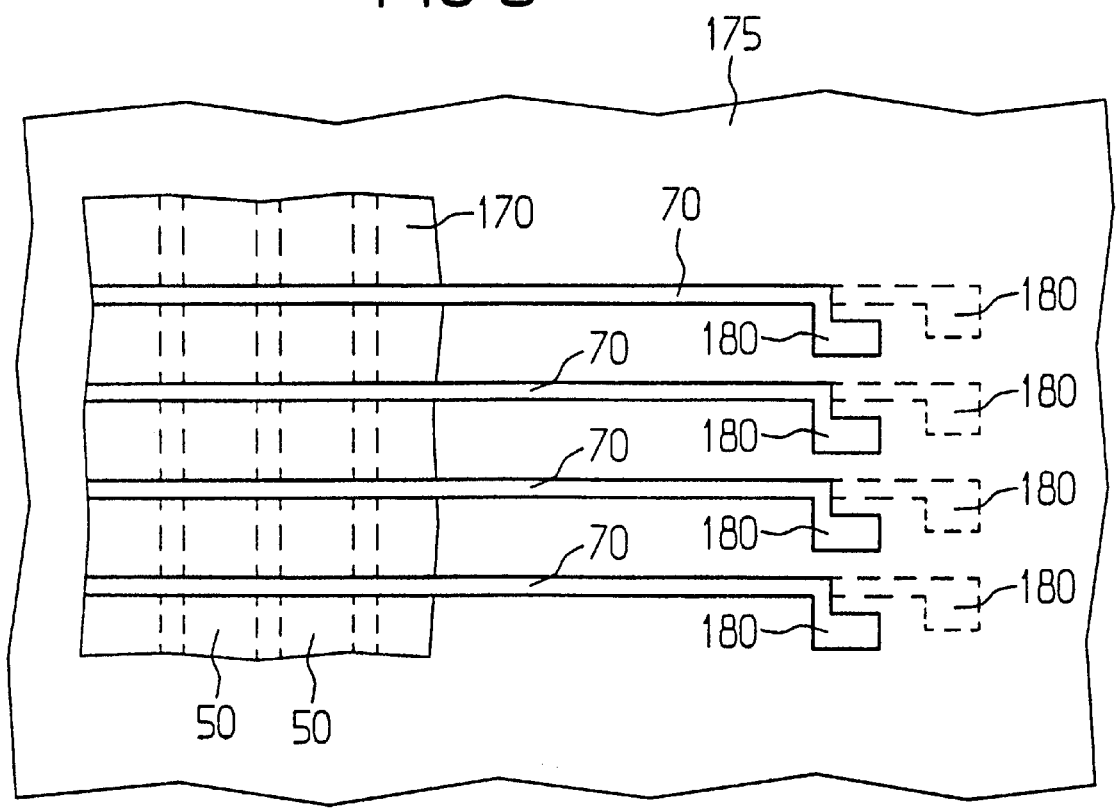

ELECTRICALLY PROGRAMMABLE NON-VOLATILE MEMORY CELL CONFIGURATION

BACKGROUND OF THE INVENTION

Field of the Invention

The invention lies in the semiconductor technology field. More specifically, the invention relates to an electrically programmable, non-volatile memory cell configuration having a semiconductor substrate of a first conductivity type, in which at least one first address line and at least one second address line are provided and the second address line crosses the first address line with a space between them;

in which a memory cell is located essentially between the first address line and the second address line, is arranged at least partially in the semiconductor substrate and has, there, at least one first doped region of the second conductivity type forming a direct junction between the two conductivity types, in which case this junction allows an electrical current flow between the first address line and the second address line in the semiconductor substrate to be limited unidirectionally; and in which at least one intermediate layer, which is part of the memory cell, is located on the semiconductor substrate between the first address line and the second address line.

The invention further pertains to a method of producing such a memory cell configuration.

A large number of different memories are used for data processing. For example, a computer contains both a read only memory ROM as well as a dynamic memory (Dynamic Random Access Memory) DRAM. DRAMs are so-called volatile memories, in which the stored information must be refreshed regularly. In contrast to this, data refreshing is not necessary in so-called read only memories (ROMs), since the data are stored permanently. Normally, data are stored in a read only memory during its production process. However, in contrast, programmable read only memories are more advantageous, in the case of which a suitable programming technique is used to write the information to these read only memories only after they have been produced. Such read only memories are also referred to as Programmable Read Only Memories (PROMs).

A programmable read only memory is described, for example, in U.S. Pat. No. 5,536,968 to Crafts et al. The essence of that read only memory is a diode matrix in which each matrix element comprises a diode and a thermal resistance element, and is connected to in each case one data input line and one data output line. The resistance elements, which are of relatively complex design, occupy a large amount of space and produce the connection between the data input lines and data output lines via the diodes, can be caused to melt by a current surge. This results in the electrical connection within a matrix element being interrupted, and thus in information being stored there. When the resistance element is intact, the matrix element represents, for example, a logic 1, while, in contrast, when the resistance element has been melted, it represents a logic 0. This information can subsequently be interrogated by checking the individual matrix elements.

A memory cell of the type mentioned initially is disclosed, for example, in U.S. Pat. No. 4,677,742 to Johnson. In that memory cell configuration, first address lines and second address lines which each run parallel to one another are arranged on a semiconductor substrate. The first address lines and second address lines cross, with a space between them formed by the semiconductor substrate. A so-called PIN diode has in each case been formed, by successive deposition of a plurality of semiconductor layers, at the intersections between the first address lines and second address lines. Furthermore, a layer whose resistance value can be changed once is located between each diode and each address line, whose resistance value governs the memory content of each individual memory cell located in the intersection area of the address lines. The space requirement for this memory cell configuration is, disadvantageously, relatively high. If, for example, the smallest technologically achievable structure width is denoted by F, then a memory cell in the memory cell configuration described by Johnson requires an area of 4 $F^2$.

SUMMARY OF THE INVENTION

It is accordingly an object of the invention to provide a memory cell configuration, which overcomes the above-mentioned disadvantages of the heretofore-known devices and methods of this general type and the individual memory cells of which require only a small amount of space.

With the foregoing and other objects in view there is provided, in accordance with the invention, an electrically programmable, non-volatile memory cell configuration in a semiconductor substrate of a first conductivity type. The configuration comprises:

a trench with at least one side wall is formed in the semiconductor substrate;

at least one first address line running along the side wall of the trench in the substrate, and at least one second address line in the substrate crossing the first address line at a spaced distance therefrom;

a memory cell substantially between the first address line and the second address line at least partially in the semiconductor substrate, the memory cell having at least one first doped region of a second conductivity type forming a direct junction between the first and second conductivity types, the direct junction allowing an electrical current flow between the first address line and the second address line in the semiconductor substrate to be limited unidirectionally; and at least one intermediate layer on the semiconductor substrate between the first address line and the second address line forming a part of the memory cell.

According to the invention, the first address line is routed along a side wall of the trench. This opens up the possibility of producing memory cells which require less space. The first address line arranged on the side wall may be designed to be relatively thin, seen in cross section, but nevertheless broad, that is to say extending relatively far into the depth of the trench, without resulting in any additional space requirement. The trench need only be designed to be deep enough for this purpose. It is advantageous in this case that the relatively broad first address line has a low electrical resistance, even with a small structure width F, owing to its relatively large cross-sectional area.

It is furthermore advantageous that a first address line can be arranged, for example, on each of the opposite side walls of the trench, so that two first address lines are accommodated in a trench having a structure width of 1 F, at the same time. This reduces the space requirement for an individual memory cell at least to 2 $F^2$. If, for example, a technologically achievable structure width F of 0.18 μm is assumed, then the necessary space requirement is only 0.0648 $\mu m^2$. Roughly 15 bits can thus be stored per $\mu m^2$.

The first address line is preferably composed of a semiconductor material which is doped by a dopant of the second conductivity type. It has been found to be advantageous to produce the first address line from in-situ-doped polysilicon having a dopant content of between $10^{20}/cm^3$ to $10^{22}/cm^3$. Arsenic or phosphorus may be used, for example, as dopants for n-doping. The first address lines may also, of course, be p-doped. The semiconductor substrate is then n-conductive.

The high dopant content on the one hand ensures that the polysilicon conductivity is high, as a result of which the first address line may be designed in a particularly space-saving manner. On the other hand, the high dopant content of the first address line provides a large reservoir of dopants, which contributes to the formation of the first doped region of the second conductivity type. The dopants contained in the first address line diffuse, for example activated by a thermal process, to a certain extent into the semiconductor substrate of the first conductivity type, where they form the first doped region. This results in a direct junction between the two conductivity types being formed in the semiconductor substrate, limiting the current flow through this junction unidirectionally. This junction, for example a pn junction, in the simplest case is represented by a diode. The diode which is arranged in each memory cell avoids crosstalk to other memory cells and to other second address lines.

The term first conductivity type may be understood to mean either a p-conductor or an n-conductor. The second conductivity type is then of the opposite type in either case.

It has furthermore been found to be extremely advantageous to produce the first doped region in the immediate vicinity of the first address line. This allows the doped region to be designed to be self-adjusting and in a space-saving manner with respect to the first address line. The first address line on the side wall of the trench is also preferably formed to be self-adjusting. This results in the first address line being in the form of a self-adjusting edge web. There is no need for any additional mask steps.

One advantageous embodiment of the invention is wherein the intermediate layer is arranged directly between the first doped region of the memory cell and the first address line on the side wall of the trench.

The intermediate layer arranged between the first address line and the first doped region is likewise preferably designed to be self-adjusting. The diffusion of the dopants through the intermediate layer to form the first doped region is only insignificantly affected by this. This intermediate layer preferably has a thickness of between 3 and 20 nm, in particular preferably between 3 and 8 nm.

The intermediate layer is preferably composed of an oxide. Oxides, for example gate oxides, have relatively well defined breakdown voltages, so that the intermediate layer can be made conductive by applying a voltage of suitable magnitude to the first address line and the second address line. This is essentially done by forming conductive paths in the oxide. The magnitude of the voltage difference between the first address line and the second address line, and thus the intensity of the required current pulse to produce conductive paths, depends, inter alia, on the thickness of the intermediate layer. In order to avoid excessively high voltages, and thus high power losses, it is recommended that the intermediate layer be designed to be sufficiently thin. One preferred oxide is, for example, silicon oxide ($SiO_x$). The resistivity of the oxide used should be sufficiently high that, when the oxide is intact, an applied voltage is essentially dropped across the intact oxide. In this case, it is also necessary to consider all the other resistances which are connected in series with the oxide (for example the total resistance formed from the intrinsic resistance of the address lines and the semiconductor substrate) as well as the input impedance of a downstream measuring device. In contrast to this, once the oxide has broken down electrically, its resistance should then make only a minor contribution to the total resistance, so that the applied voltage is dropped across the input of the measuring device. If, for example, the resistance of the oxide used is $10^{12}$ ω/cm then a 10 nm thick oxide has a resistance of $10^6$ ω.

A preferred memory cell configuration is characterized, inter alia, as follows:

the trench is one of a large number of trenches formed in the semiconductor substrate substantially parallel to one another and having webs disposed in between, the trenches have side walls on the webs and at least one first address line runs on each the side wall along the trenches;

the webs have isolation regions extending transversely to the trenches, the isolation regions divide the webs into individual, mutually isolated, semiconductor substrate regions of the first conductivity type, whereby at least two first doped regions are located in each the semiconductor substrate region and are each associated with a respective memory cell; and each the semiconductor substrate region is connected to a respective the second address line running transversely to the first address lines and at a distance therefrom.

The novel memory cell configuration accordingly has a large number of memory cells, at least some of which are located in the individual semiconductor substrate regions. A memory cell includes both the junction (arranged in the semiconductor substrate region) between the two conductivity types and the intermediate layer which is located between the first doped region and the first address lines. Thus, in an equivalent circuit, a memory cell comprises a diode connected in series with a capacitor. The capacitor electrode facing away from the diode is preferably formed by the first address line. The diode, formed from the first doped region and the semiconductor substrate region, allows current to flow in only one direction. The capacitor formed by the intermediate layer may also be regarded as a resistance element. The respective memory cells are made contact with by the first and second address lines. At least two first address lines, which are arranged one above the other, preferably run on each side wall of the trenches.

The side walls of the trenches may run either vertically and thus parallel to one another, or may be slightly inclined with respect to one another. However, vertical side walls are preferable in terms of optimum space utilization.

Each semiconductor substrate region has at least one second doped region of the first conductivity type for low-resistance connection of the semiconductor substrate regions to the second address lines. This second doped region is normally more strongly doped than the semiconductor substrate region and, in consequence, has higher conductivity than it. This stronger doping results, for example, in good resistive contacts being produced to the second address lines, while avoiding parasitic capacitances.

The semiconductor substrate is preferably arranged on a base substrate. This base substrate may be either an insulator or a semiconductor material. If an insulator is used, then the individual semiconductor substrate regions which extend as far as the base substrate are isolated from one another on their lower face by this base substrate. At the sides, the semiconductor substrate regions are on the one hand separated by the trenches and are on the other hand isolated by the isolation regions, which are filled with an insulating material, extend transversely with respect to the trenches, and pass through them. This prevents inadvertent short-circuiting of the individual semiconductor substrate regions and, in consequence, of memory cells in adjacent semiconductor substrate regions.

If the base substrate is a semiconductor material, the individual semiconductor substrate regions are preferably isolated on their lower face by third doped regions of the second conductivity type. These doped regions are located either in the base substrate or on the side of the semiconductor substrate regions facing the base substrate.

In one preferred embodiment, the second address lines are arranged on the base substrate. If the base substrate is an insulator, the second address lines, which are preferably in the form of strips, are preferably composed of a conductive semiconductor material or of metal. If a semiconductor material is used as the base substrate, the second address lines may be created by doping in the form of strips in the base substrate. On their side facing the base substrate, the semiconductor substrate regions may have second doped regions of the first conductivity type, thus ensuring a low-resistance connection between the second address lines and the semiconductor substrate regions.

In accordance with again another feature of the invention, the trenches are filled with an isolating layer on which the second address lines are located.

In this case, the second address lines are arranged on the upper face of the semiconductor substrate regions. The isolating layer, which is preferably designed to be planar, is located between the second address lines and the semiconductor substrate regions. In order to reduce mask steps, the second doped regions on the upper face of the semiconductor substrate regions are formed after the creation of contact holes in the isolating layer. This is achieved by the semiconductor substrate regions being doped through the contact holes with a dopant of the first conductivity type. In consequence, these semiconductor substrate regions are formed on the one hand to be self-adjusting, and on the other hand with as little lateral space requirement as possible. If required, it is possible to fill the trenches only up to their upper edge, so that the upper face of the semiconductor substrate regions ends flush with the filled trenches. In this case, the second address lines are seated directly on the semiconductor substrate regions.

The memory cells are preferably combined in a memory cell field. This memory cell field is represented, for example, by a diode matrix. In order to actuate the individual memory cells, the first address lines are routed out of the memory cell field to the periphery of the semiconductor substrate. There, the first address lines have individual contact regions, which are isolated from one another. Since the first address lines are partially routed one above the other in a trench, the individual contact regions must be etched successively, using appropriate masks.

At least two first address lines arranged one above the other preferably run on each side wall of each trench. The space requirement per memory cell is thus reduced to as little as 1 $F^2$. If, in contrast, three address lines are routed one above the other along each side wall, then the space requirement per memory cell is now only $\frac{2}{3}$ $F^2$. If there are four address lines per side wall, the space requirement is reduced to $\frac{1}{2}$ $F^2$. In this case, 1 bit may be stored per memory cell. The memory cell configuration according to the invention in principle allows the space required per memory cell to be reduced indefinitely. In principle, all that is required to do this is to etch the trenches to an appropriate depth and to form a large number of first address lines on the side walls.

With the above and other objects in view (e.g. small space requirement) there is also provided, in accordance with the invention, a method of producing an electrically programmable, non-volatile memory cell configuration, such as the one outlined above. The method comprises the following steps:

providing a semiconductor substrate of a first conductivity type;

forming mutually parallel isolation trenches in the semiconductor substrate;

filling the isolation trenches with an insulating material and forming isolation regions in the isolation trenches;

incorporating mutually parallel trenches transversely to the isolation trenches in the semiconductor substrate, retaining webs between the trenches, whereby the webs are subdivided by the isolation regions of the isolation trenches into individual semiconductor substrate regions of the first conductivity type;

forming an intermediate layer on the side walls of the trenches;

applying first address lines of a second conductivity type to the side walls of the trenches, whereby the first address lines contain a dopant of the second conductivity type; and heat-treating the semiconductor substrate at a predetermined diffusion temperature, and partially diffusing the dopant out of the first address lines, through the intermediate layer, and into the semiconductor substrate regions, for forming therein first doped regions of the second conductivity type with a direct junction to the first conductivity type.

A primary idea of the invention is that the first doped region is designed to be self-aligned in the semiconductor substrate. To this end, a semiconductor substrate of the first conductivity type, on which a first address line of the second conductivity type is arranged, is subjected to a temperature step. The dopants of the second conductivity type which are contained in the first address line diffuse, during this diffusion step, through the intermediate layer into the semiconductor substrate region, where they form a first doped region of the second conductivity type. The heat-treatment or diffusion step is in this case carried out for a predetermined time period, and at a predetermined diffusion temperature. The time duration and the diffusion temperature are in this case preferably matched to one another such that the first doped region is formed to a desired depth in the semiconductor substrate. This at the same time results in a direct junction from the second conductivity type to the first conductivity type, which blocks current flow in one direction, as a diode junction.

In order to produce the memory cell configuration, insulating trenches which run parallel to one another are first of all incorporated into the semiconductor substrate of the first conductivity type, and are then filled with an insulating material. The isolation trenches filled in this way represent the isolation regions. Trenches running transversely with respect to the isolation trenches are then etched in the semiconductor substrate, with webs remaining between the trenches. The width of the webs, of the trenches and of the isolation trenches preferably in each case corresponds to the structure width 1 F. The webs are subdivided by the previously formed isolation regions into individual semiconductor substrate regions of the first conductivity type. The cross section of an individual semiconductor substrate region, looking at the semiconductor substrate from above, is thus 1 F2. Once the individual, mutually isolated, semiconductor substrate regions have been created, an intermediate layer is formed on the side walls of the trenches, in the form of a self-adjusting edge web. This is achieved, for example, by conformal deposition and subsequent anisotropic etching of an oxide. The oxide is applied comparatively thinly, preferably between 3 nm and 10 nm. The formation of the intermediate layer is followed by the application of first address lines of the second conductivity type to the side walls of the trenches. At least one first lower address line and one first upper address line, which is arranged above it and is separated from the first lower address line, are preferably formed on each side wall of the trenches. These address lines are likewise formed as self-adjusting edge webs. This is preferably done by depositing an in-situ-doped polysilicon layer conformally onto the semiconductor substrate. The material thickness of this polysilicon layer depends on the desired technological structure width F. In any case, the thickness of the polysilicon layer should be less than F/2. After the anisotropic etching of the polysilicon layer to form the address lines in the form of self-adjusting edge webs, the semiconductor substrate is heat-treated at a predetermined diffusion temperature. In the process, the dopants in the address lines are activated and, at the same time, diffuse through the intermediate layer into the semiconductor substrate regions, where they form the first doped regions of the second conductivity type. This results in the formation of junctions, which block the current in one direction, between regions of the first conductivity type and of the second conductivity type.

Before being structured, the semiconductor substrate is preferably applied epitaxially on a base substrate. This base substrate may be, for example, a semiconductor material. In order to isolate the semiconductor substrate regions on their side facing the base substrate, doped regions of the second conductivity type are formed there. This results in a second direct junction from the first conductivity type to the second conductivity type in the individual semiconductor substrate regions. If the base substrate and the semiconductor substrate regions are, for example, p-conductive, the n-conductive doped region on the side of the semiconductor substrate region facing the base substrate creates a pnp junction, which prevents current from flowing in either direction. The individual semiconductor substrate regions are thus effectively isolated from one another.

It is also advantageous, in the case of a base substrate of the second conductivity type, that is to say if the conductivity type is the opposite of that in the semiconductor substrate regions, to form the second address lines in the base substrate. These are then of the first conductivity type and are directly connected to the semiconductor substrate regions. On the other hand, owing to the base substrate being of the second conductivity type, the individual semiconductor substrate regions, which are located transversely with respect to the second address lines, are effectively insulated from one another since two junctions of opposite polarity are in each case formed between adjacent address lines.

If an insulation material is used as the base substrate, there is no need for any further isolation between the individual semiconductor substrate regions. In fact, second address lines can be applied to the base substrate in a simple manner in this case, making direct contact with the semiconductor substrate regions arranged above them.

If the second address lines are arranged above the semiconductor substrate regions, a planar, isolating layer is applied to the trenches and to the webs before the formation of these address lines. After this, contact holes which extend as far as the semiconductor substrate regions are etched in the isolating layer, through which a dopant of the first conductivity type is introduced into the semiconductor substrate regions. This doping steps improves the contact characteristics between the semiconductor substrate regions and a conductive material filling the contact holes. The contact holes are preferably filled to the isolating layer, at the same time that the second address lines are deposited. Suitable materials include, for example, doped polysilicon, aluminum or an aluminum/copper alloy.

The memory cells combined in a memory cell field can, furthermore, preferably be addressed via the address lines which are routed to the periphery of the memory cell field. For this purpose, the conformally deposited first address lines, which are initially still unstructured, are structured at the periphery of the memory cell field using a suitable photographic technique, so that individual, mutually isolated contact regions are created. In the process, one contact region is in each case connected to just one first address line. Trim masks are used to separate the first lower address lines, which are located in a common plane. Structurally identical trim masks can also be used to separate the upper first address lines.

No additional masks are required to make contact with the second address lines, since these second address lines are preferably routed alongside one another, and not one above the other, like the first address lines.

Other features which are considered as characteristic for the invention are set forth in the appended claims.

Although the invention is illustrated and described herein as embodied in an electrically programmable, non-volatile memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 7A–7B are perspective views of a third configuration of the base substrate;

FIG. 8 is a diagrammatic plan view of an option for making contact with the first address lines.

DESCRIPTION OF THE PREFERRED EMBODIMENTS

Figure 1:
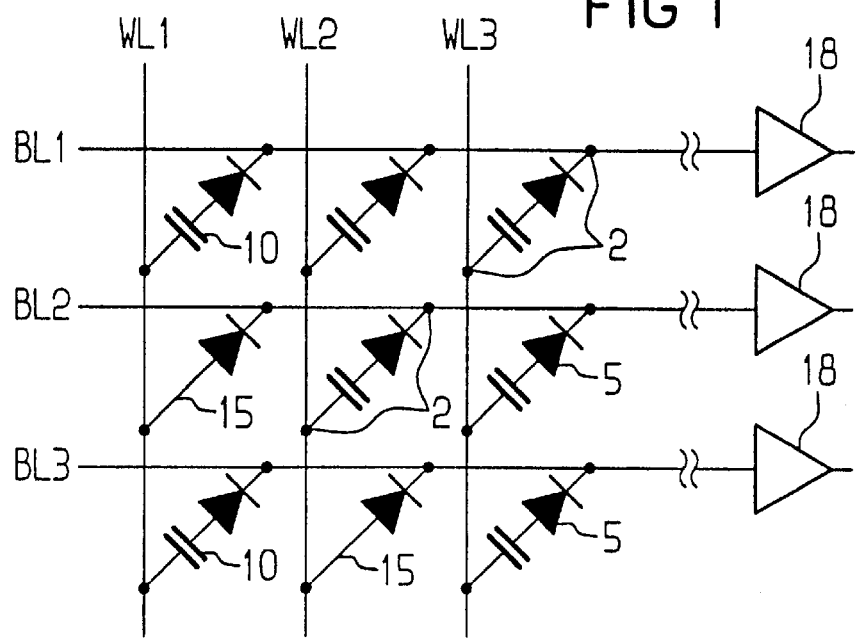
FIG. 1 is a circuit diagram of a memory cell configuration according to the invention.

Referring now to the figures of the drawing in detail and first, particularly, to FIG. 1 thereof, there is seen a circuit diagram of the basic design of a memory cell configuration according to the invention. In principle, the memory cell configuration has a large number of mutually crossing address lines. First address lines are in this case denoted, by way of example, as word lines 1 to 3 (WL1 . . . 3), and the second address lines as bit lines 1 to 3 (BL1 . . . 3). A memory cell 2, which is represented by a diode 5 and a capacitor 10, is in each case located in the area where the individual word lines and bit lines cross. The diode 5 limits any current flow between the word line and bit line to one direction, so that, for example, current can flow only from the word line to the bit line, but not vice versa. This prevents erroneous reading of the memory content of the individual memory cells 2 via unaddressed memory cells 2. If no data have been written to the individual memory cells, the capacitors block any current flow between the bit line and word line and thus represent, for example, a logic 0. However, by applying an excess voltage to the individual capacitors 10, they can be broken down electrically, thus allowing a current to flow. At the same time, this changes the memory content of each memory cell 2. If an intact capacitor 10 represents the logic value 0, then an electrically broken-down capacitor 10 represents the logic value 1. If, for example, an oxide is used as the capacitor dielectric, then an intact oxide blocks any current flow between the word line and bit line, and thus represents the logic value 0. After destruction of the oxide, a current can flow between the word line and bit line, which corresponds to a logic 1. A broken-down oxide is characterized by a direct connection 15 between the diode 5 and the word line. The current flow between the word line and bit line can be measured and processed further by suitable amplifier elements 18 connected to the bit lines.

Silicon oxide ($SiO_2$) is used, for example, as the capacitor dielectric. The material has a breakdown charge of about 10 $C/cm^2$ ($Coulomb/cm^2$). If a voltage of 10 volts is applied to a capacitor dielectric with a thickness of 10 nm (resultant field strength 10 MV/cm), a current of about 1 $mA/cm^2$ flows, and this in each case increases by a factor of 10 per volt. With 10 volts, this thus results in a programming time for programming a memory cell of about 1000 s, or 1 ms at 16 volts. However, it is more advantageous to design the capacitor dielectric to be thinner, in order to reduce the high power loss which occurs during electrical breakdown. For example, a memory cell configuration having a capacitor dielectric with a thickness of 3 to 4 nm can be operated at about 1.5 V. The capacitor dielectric does not yet break down at this voltage, so that 1.5 V is sufficient to read data from the memory cell. Data are stored, for example, at 5 V, in which case one cell strand in a memory cell configuration can be programmed within about 1 ms. The energy loss which occurs in this case per $cm^2$ of capacitor dielectric is then about 50 Ws (10 Coulomb*5 V). If the desired power loss is about 0.5 W, about 100 s are required to program a 1 Gigabit memory. If the permissible power losses are higher, the programming can be carried out correspondingly more quickly. The memory cell configuration according to the invention thus allows relatively simple and fast storage of large amounts of data. The size of the memory cell configuration, that is to say its memory capacity, can be matched to the respective application. It is thus even possible to produce a memory cell configuration having a capacity of more than one Gigabit.

Figure 2:
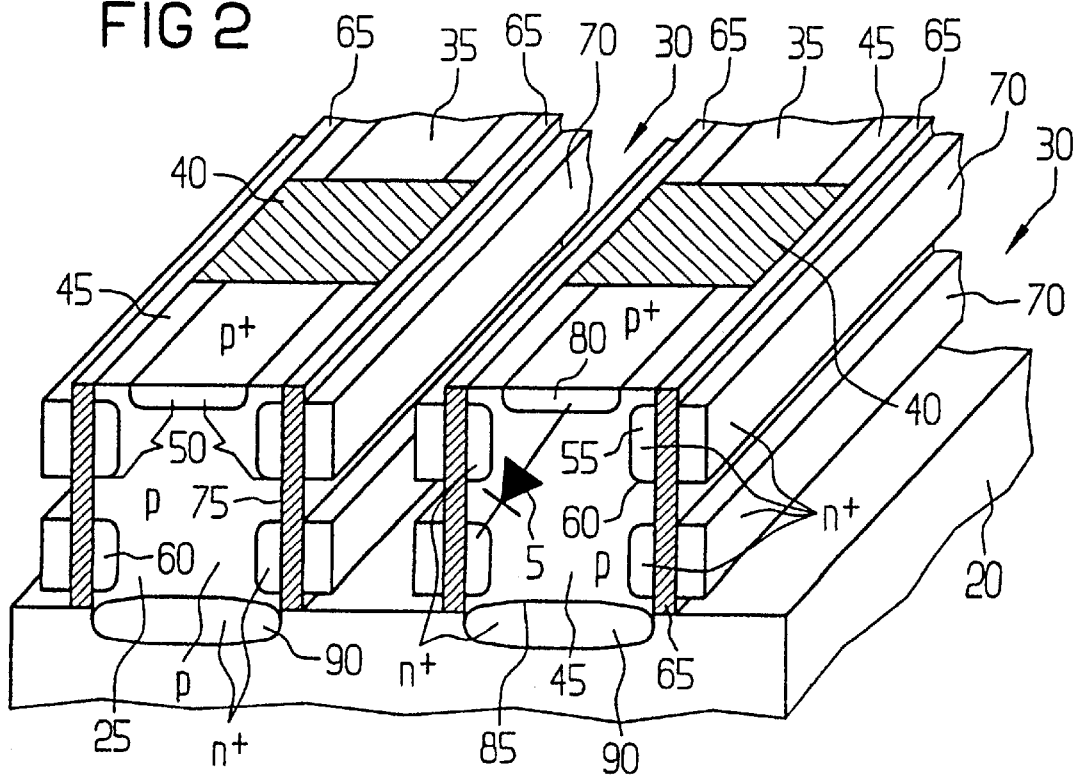
FIG. 2 is a perspective view of a memory cell configuration provided with trenches.

Referring now to FIG. 2, there is shown the design of a memory cell configuration according to the invention. A semiconductor substrate 25 is arranged on a base substrate 20. Individual trenches 30 run in this semiconductor substrate 25, with webs 35 being located between them. The webs 35 are interrupted periodically by isolation regions 40, which subdivide the webs 35 into individual semiconductor substrate regions 45. Each semiconductor substrate region 45, which is roughly shaped like a cube, accommodates four memory cells 50, which each comprise a diode 5 and a capacitor, not illustrated here. Each diode 5 is represented by an $n^+p$ junction 60. In this case, the semiconductor substrate region 45 is p-conductive, into which a strongly doped n-conductive region 55 is incorporated. A direct junction 60 from the n-conductive region to the p-conductive region has thus been created between the n-conductive region 55 which in this case represents the first doped region 55, and the p-conductive semiconductor substrate region 45. The capacitor in each memory cell 50 is composed of the n-conductive region 55, an intermediate layer 65 (which in this case represents a capacitor dielectric) and a first address line 70. The intermediate layer 65 is located on that side wall 75 of the trench 30 on which the first address lines 70 also run. Thus, with regard to the capacitor, the first address line 70 at the same time forms a first capacitor electrode, the intermediate layer 65 forms the capacitor dielectric, and the n-conductive region 55 forms the second capacitor electrode.

Furthermore, each semiconductor substrate region 45 makes contact with a second address line, which is not illustrated here, via a strongly doped, p-conductive second doped region 80. The intermediate layer 65 can be destroyed locally by application of an excess voltage. In order to achieve this, an excess voltage of suitable magnitude is applied to in each case one selected first address line 70 and to a selected second address line. In consequence, the conductivity of the intermediate layer 65 in the respective addressed memory cell 50 is changed, thus allowing current to flow between the first address line 70 and the second address line.

In order to insulate the individual semiconductor substrate regions 45 on their side 85 facing the base substrate 20, strongly doped, n-conductive third doped regions 90 are arranged in the base substrate 20, some of which extend into the individual semiconductor substrate regions 45.

The following text will now describe the method according to the invention for producing a memory cell configuration.

Reference is had to FIGS. 3A to 3H in this context. First of all, a base substrate 20 with integrated third doped regions 90 is provided. The sizes of and the lateral distances between the third doped regions 90 are matched to one another, corresponding to the trenches and webs which will be formed later. The base substrate 20 in this exemplary embodiment is a semiconductor.

Figure 3A:
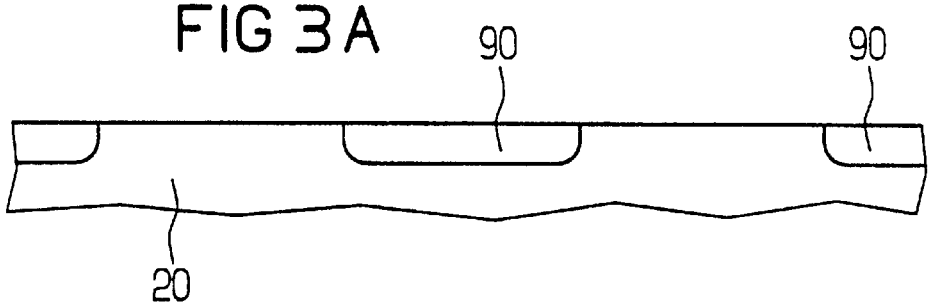
FIGS. 3A–3H are various sectional views illustrating sequential method steps in the production of a memory cell configuration.
Figure 3B:
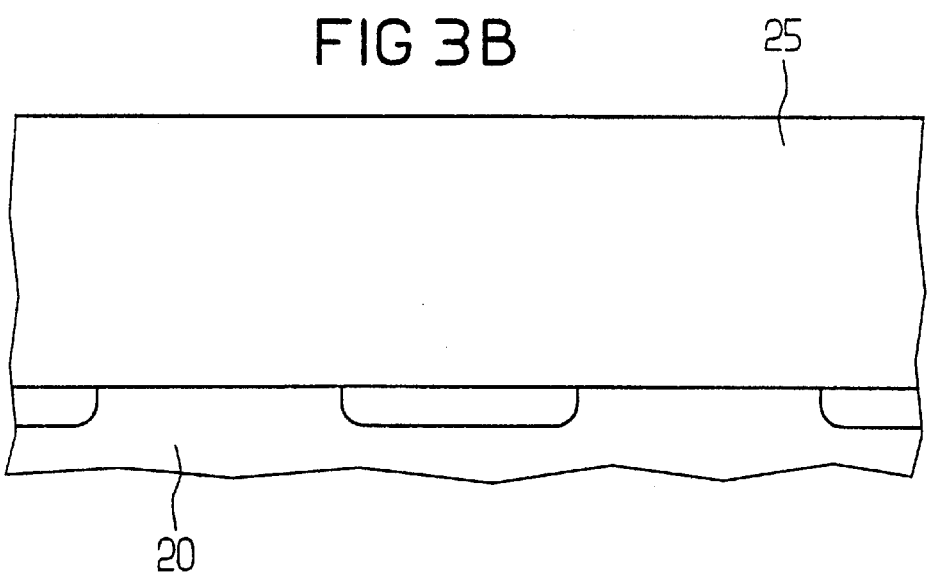
Figure 3C:
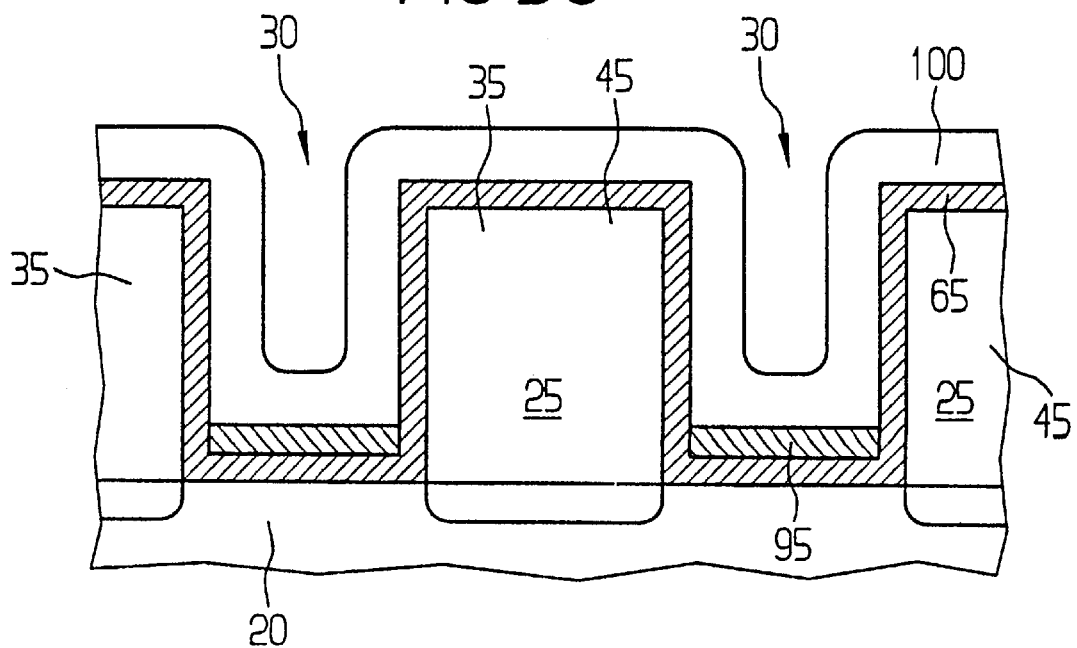
Figure 3D:
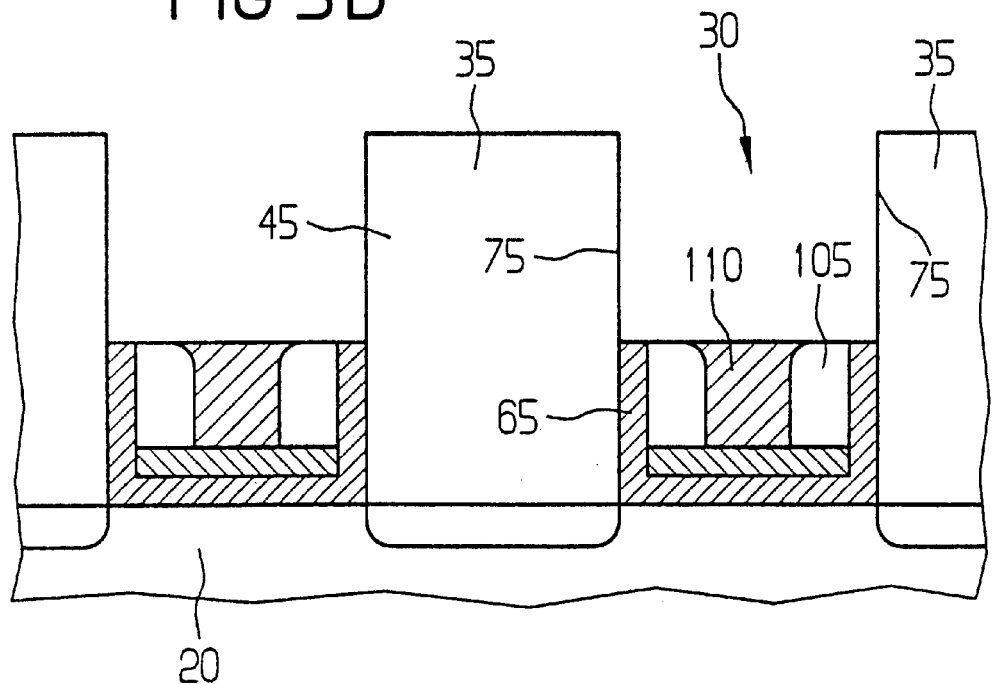

After this, a semiconductor substrate 25, preferably in-situ p-doped silicon, is deposited epitaxially onto the base substrate 20. Isolating trenches are then incorporated in the semiconductor substrate 25 by means of a suitable mask technique, and are filled with an insulating material. However, this method step will not be described in more detail until the reference to the subsequent figures. Once the isolation trenches have been created, the trenches 30 are etched in the semiconductor substrate 25 using a mask technique. This is followed by conformal application of the intermediate layer 65. A CVD oxide 95, preferably TEOS, is then preferably deposited in the lower region of the trenches 30, followed by conformal application of an in-situ n-doped polysilicon layer 100 to the intermediate layer 65. FIG. 3C shows the structure obtained in this way.

Figure 3E:
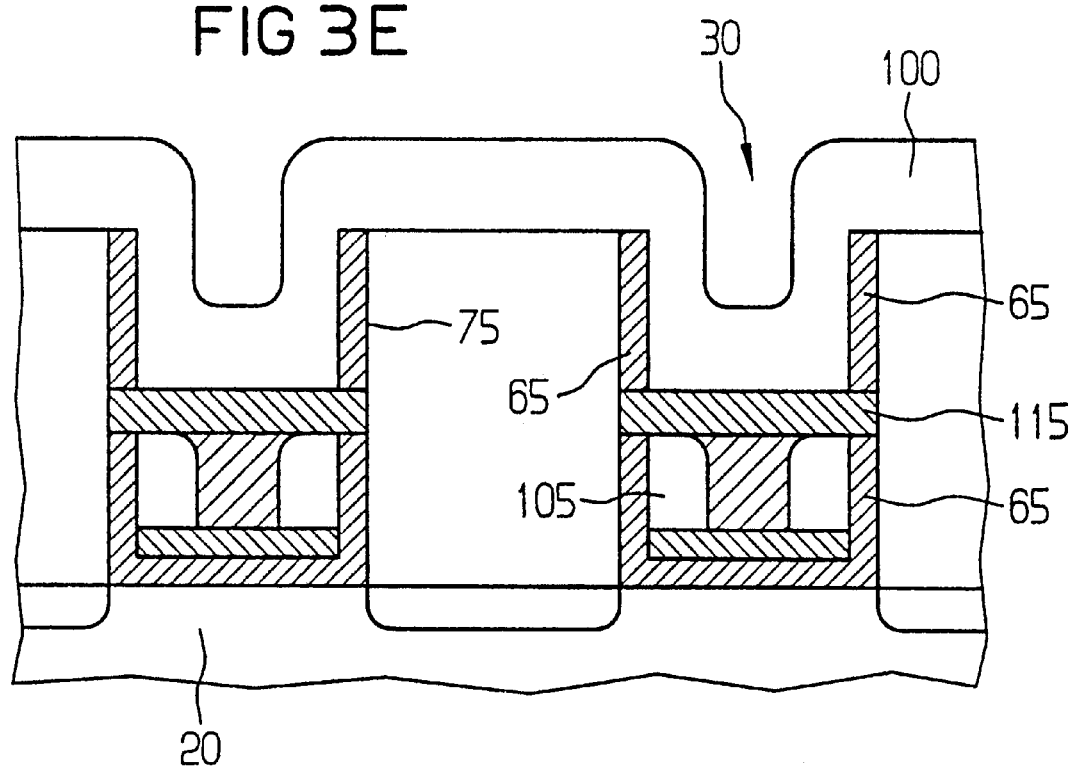
Figure 3F:
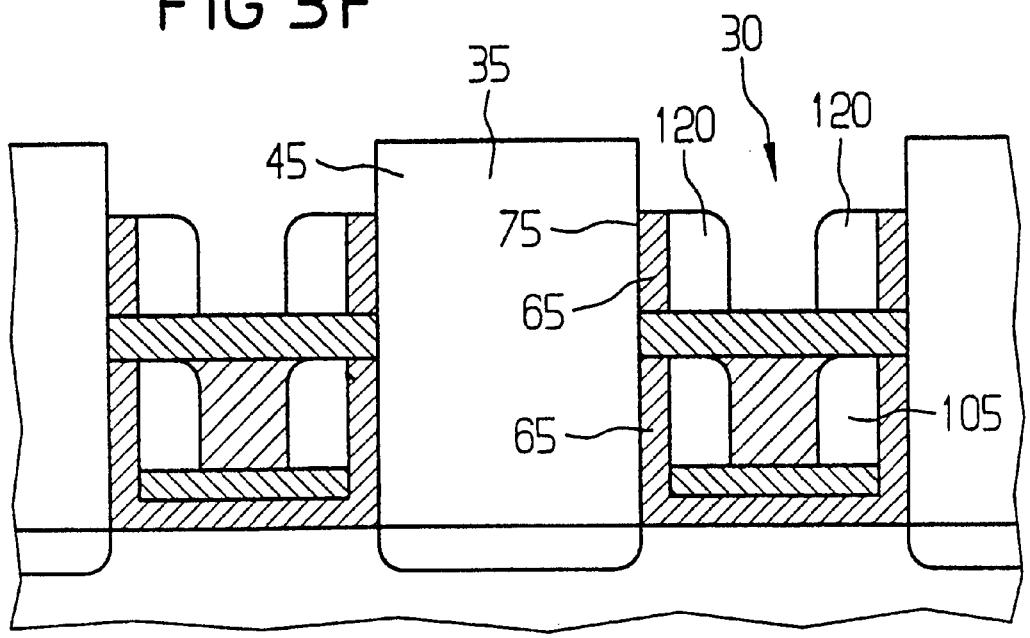
Figure 3G:
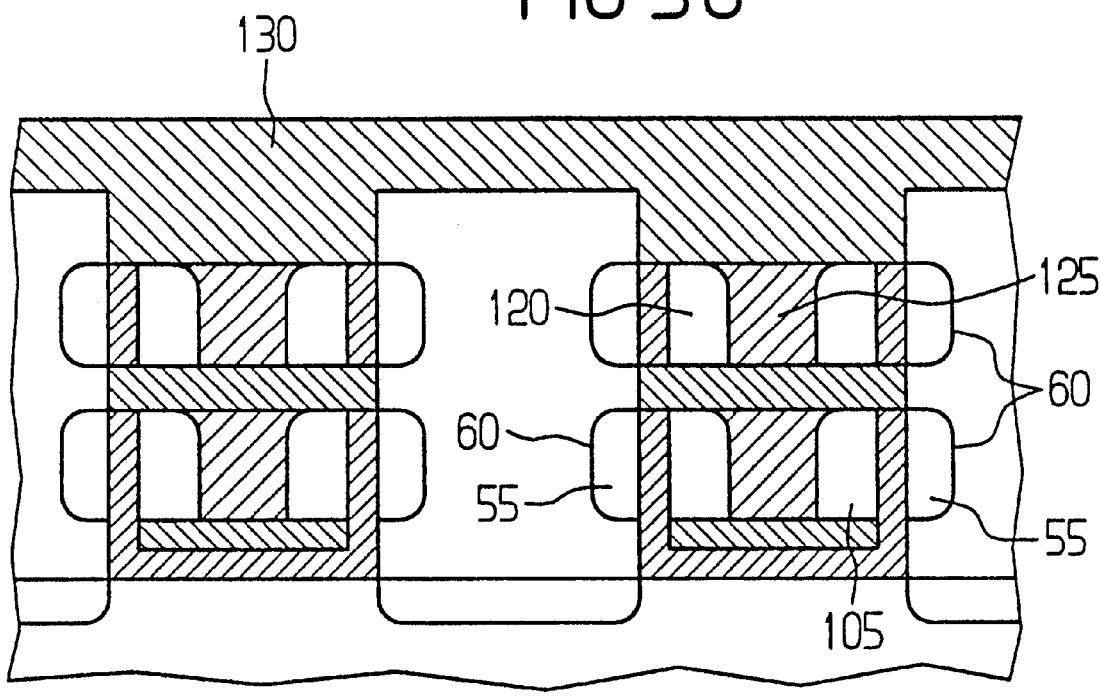
Figure 3H:
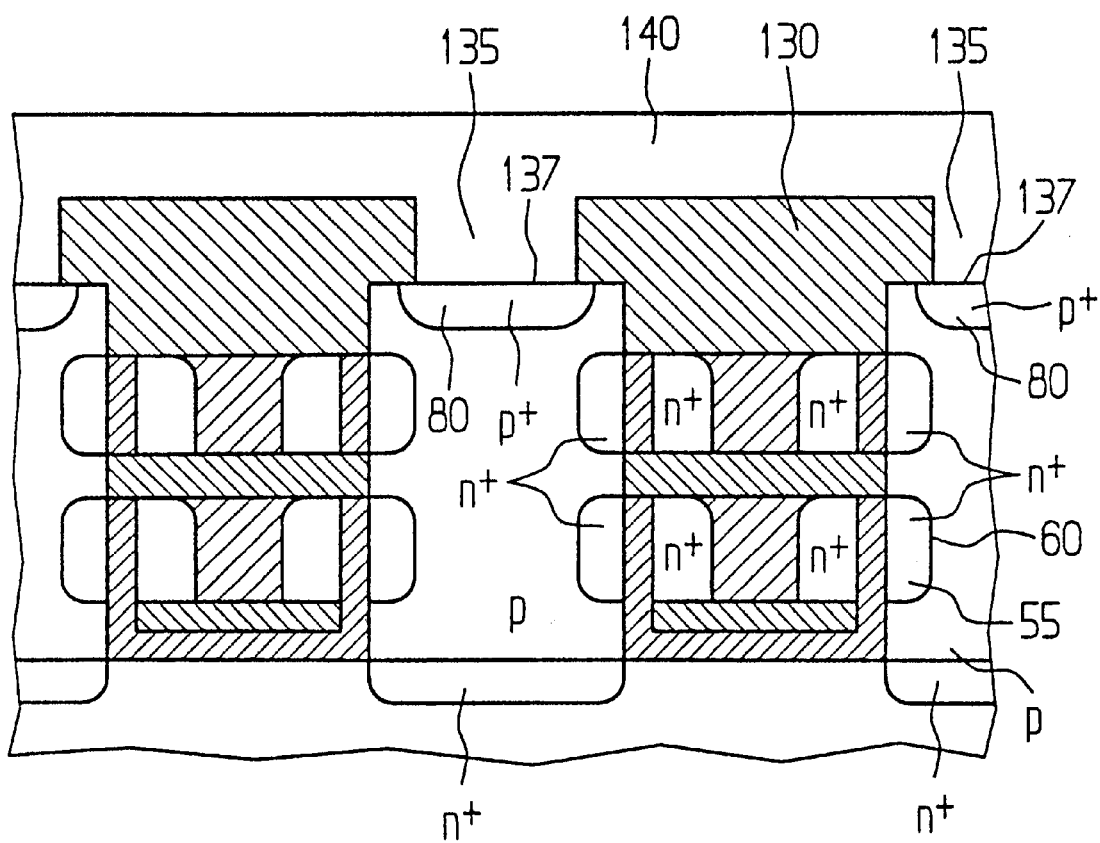

The polysilicon layer 100 and the intermediate layer 65 are then etched back anisotropically to about half the height of the trenches 30. This results in the production of first lower address lines 105 and of the intermediate layer 65 (which is arranged between the first lower address lines 105 and the side wall 75) on the side walls 75 of each trench 30. The remaining cavities between the first lower address lines 105 can be planarized using a thermal oxide 110. As is shown in FIG. 3E, after this, a further oxide 115 is first of all applied in order to cover the first lower address lines 105 and the intermediate layer 65. This is followed by the self-adjusting formation (conformal deposition with subsequent anisotropic etching) of the intermediate layer 65 on the side wall 75 in the upper region of the trench 30, to which a further polysilicon layer 100 is applied. After anisotropically etching the polysilicon layer 100, first upper address lines 120 are now produced, in a self-adjusting manner, in the upper part of the trench 30. The resultant structure is shown in FIG. 3f.

The remaining cavities are filled with an oxide 125 and with a planar isolating layer 130, with the isolating layer 130 completely covering the trenches 30 and the webs 35 arranged between the trenches 30. As a result of a subsequent temperature step, the dopants which are contained in the polysilicon layer 100 and in the first upper and lower address lines 120 and 105 partially diffuse through the intermediate layer 65 into the semiconductor substrate regions 45. In the process, the first doped regions 55 are produced, which are of the second conductivity type in comparison with the semiconductor substrate regions 45. The direct junction 60 formed in this way between the first doped regions 55 and the semiconductor substrate regions 45 acts as a reverse-biased pn junction. With a roughly 4 nm thick intermediate layer composed of silicon oxide ($SiO_2$) approximately 60 minutes are required at 1000° C. to form the first doped regions 55. If the first address lines 70, 105 and 120 have a dopant concentration of between $10^{21}$ and $10^{22}/cm^3$, then, with the above process parameters, the extent of the first doped regions 55 within the semiconductor substrate regions 45 is approximately 30 to 50 nm, with a drop-off in the dopant concentration of three orders of magnitude in comparison with the dopant concentration in the first address lines 70, 105 and 120 being used as the basis of a limit. These measurements have been verified by means of secondary ion mass spectroscopy.

In this exemplary embodiment, the intermediate layer 65 is produced underneath the first upper and first lower address line 105 and 120 by double deposition. In the process, the intermediate layer 65 for the first lower address lines 105 was produced first, followed by the first upper address lines 120. The double application of the intermediate layer 65 is recommended since the intermediate layer 65 which has already been deposited is attacked during etching of the polysilicon layer 100 to form the first lower address lines 105.

In a final method step, contact holes 135 are first of all formed in the isolating layer 130. The upper face 137 of the semiconductor substrate regions 45 can now be contacted through the contact holes 135. In order to provide a contact whose resistance is as low as possible, the semiconductor substrate regions 45 are, for this purpose, first of all provided with a strongly doped second doped region 80 on their upper face 137, which doped region is of the same conductivity type as the semiconductor substrate regions 45. These second doped regions 80 are preferably formed by means of ion implantation through the contact holes 135. No further masks are thus required. The contact holes 135 are then filled with a conductive material. For this purpose, the second address lines 140 are preferably applied to the isolating layer 130, at the same time filling the contact holes 135 in the process, and thus making contact with the semiconductor substrate regions 45 via the second doped regions 80.

Figure 4A:
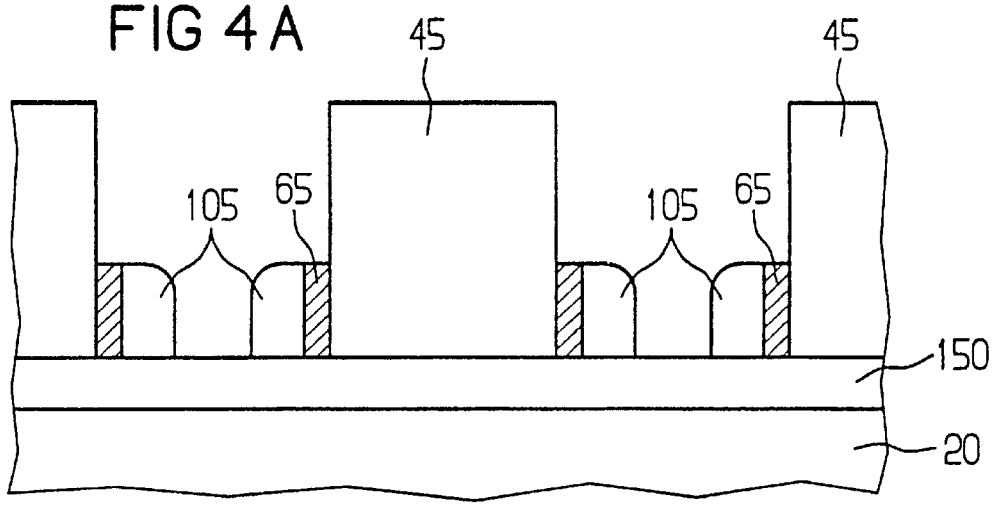
FIGS. 4A–4C are sectional views illustrating further method steps in the production of a memory cell configuration.
Figure 4B:
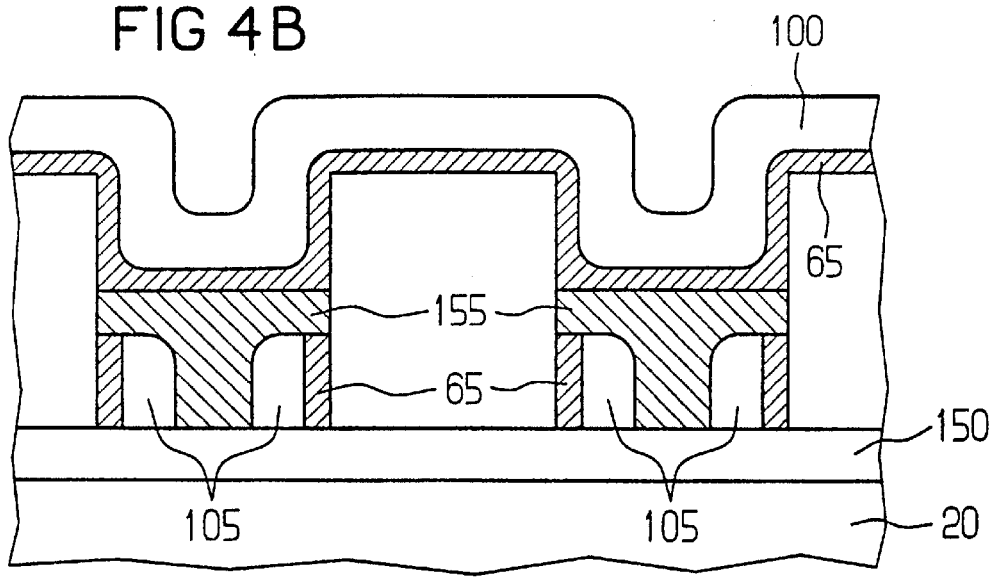
Figure 4C:
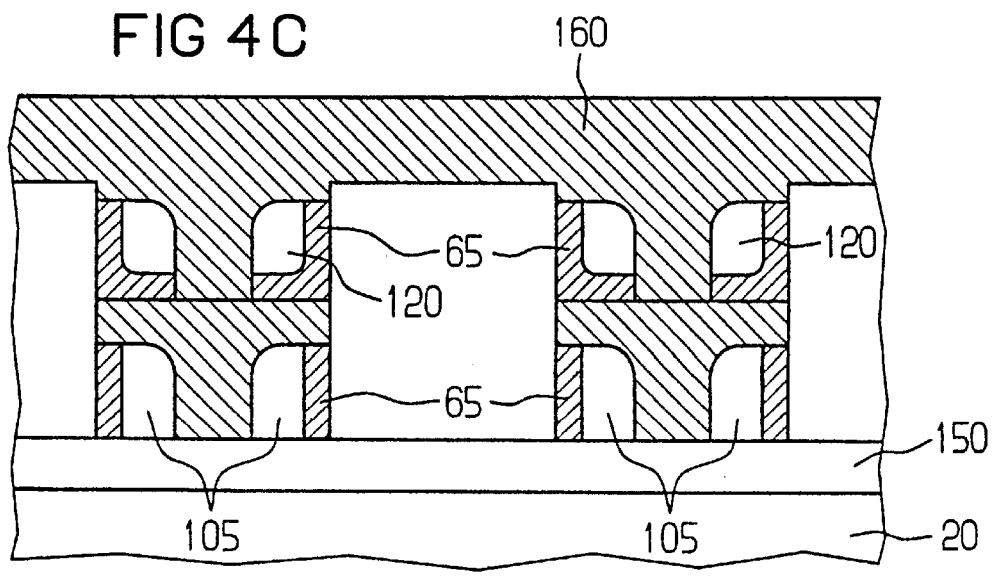

A further preferred embodiment of the production method is shown in FIGS. 4A–4C. In this case, the upper face of the base substrate 20 has an isolating layer 150 for isolation of the individual semiconductor substrate regions 45. As already described, these are created by epitaxial application of a semiconductor substrate 25, and subsequent etching. The use of the isolating layer 150 makes it possible to dispense with the deposition of an oxide on the lower face of the trenches 30. Both the intermediate layer 65 and the polysilicon layer 100 can thus be deposited directly in the trenches 30, and can be etched anisotropically. First lower address lines 105 formed as webs at the edges are shown in FIG. 4a. The remaining cavities are then filled with an oxide 155, and the first lower address lines 105 are completely covered in the process. The intermediate layer 65 and the polysilicon layer 100 are then deposited onto the trenches 30, which have been roughly half-filled. The polysilicon layer 100 and the intermediate layer 65 are now jointly etched anisotropically. The structure obtained, which is planarized with a further oxide 160, is shown in FIG. 4C.

Figure 5A:
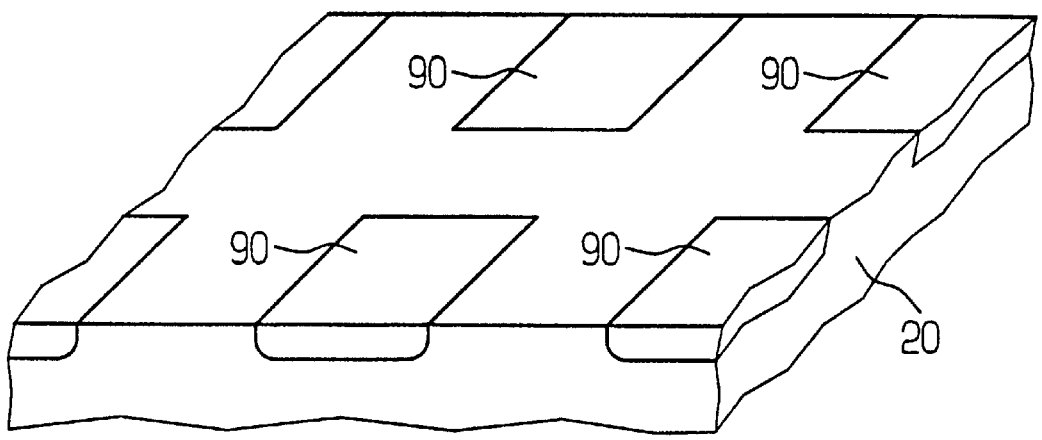
FIGS. 5A–5D are perspective views of a first configuration of the base substrate.
Figure 5B:
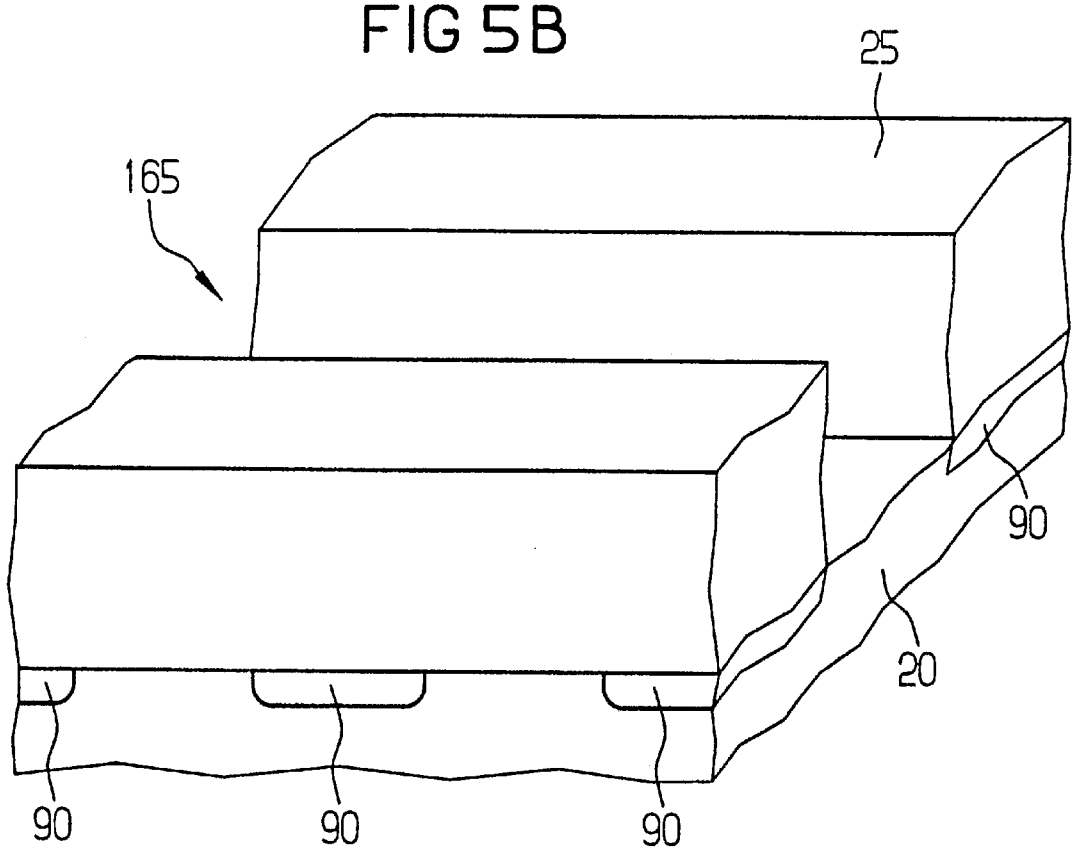
Figure 5C:
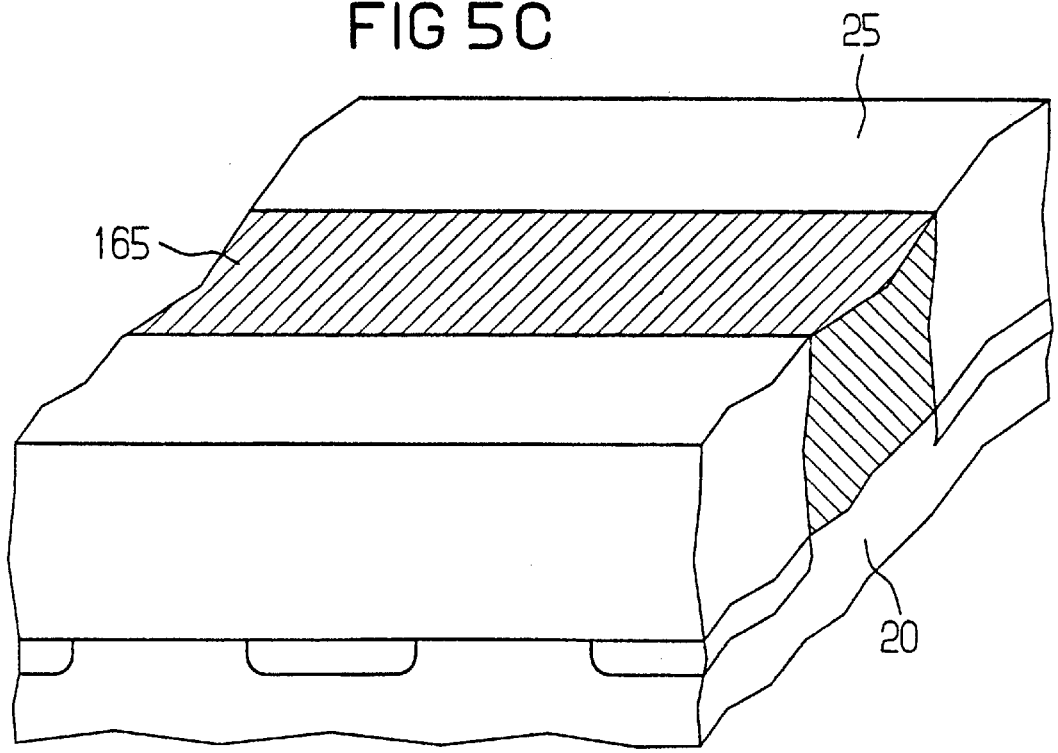
Figure 5D:
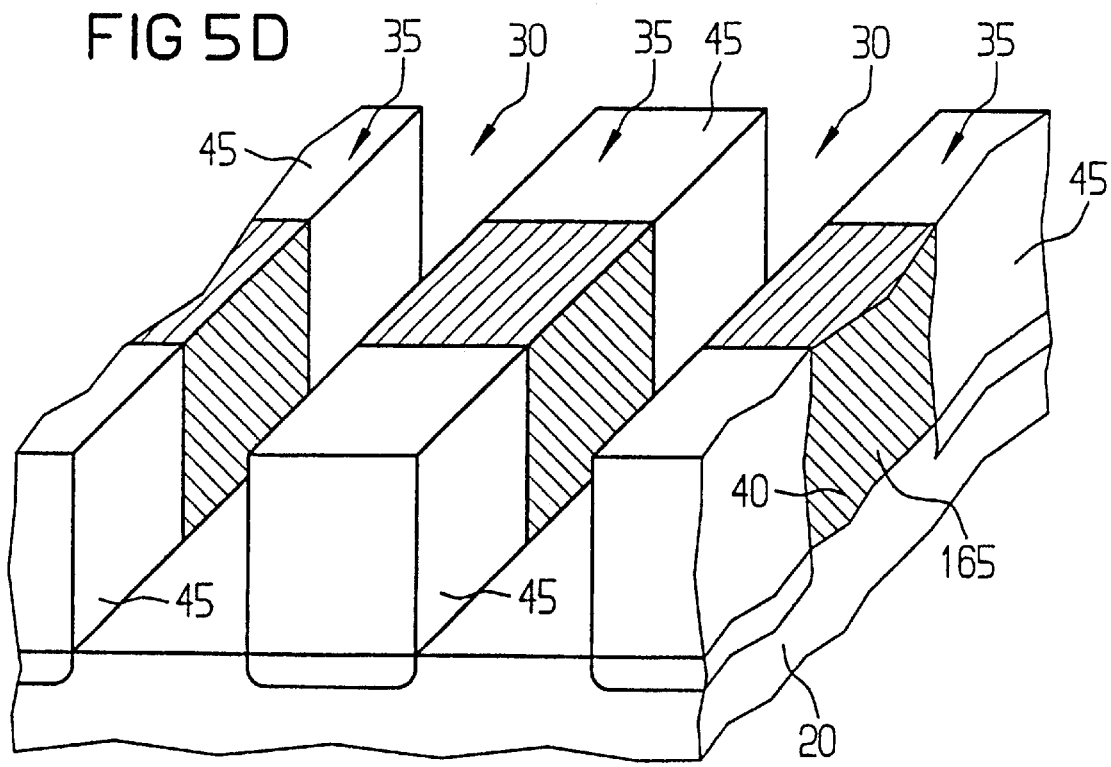

The following text will now describe preferred embodiments of the base substrate. Based on FIG. 5A, which shows a base substrate 20 with integrated doped regions 90, a semiconductor substrate 25 is first of all applied to the base substrate 20. After this, the isolation trenches 165, which run transversely with respect to the trenches 30 that are to be formed later, are anisotropically etched into the semiconductor substrate 25. After planarizing filling of the isolation trenches 165 with an insulating material, thus resulting in the production of the isolation regions 40, the trenches 30 are produced. See FIG. 5D. The webs 35 remain between them, and have isolation regions 40 passing through them periodically. Mutually isolated semiconductor substrate regions 45, between which the individual semiconductor substrate regions 45 are located, have thus been created from the semiconductor substrate 25 by the crossed-over incorporation of the isolation trenches 165 and the trenches 30. In one direction, these are in each case bounded by the trenches 30, and in the other direction they are bounded by the isolation regions 40. The base area of the semiconductor substrate regions 45 is 1 $F^2$, where F is the smallest technologically achievable structure width (governed essentially by the lithography methods used). The depth of the individual trenches 30 depends on the number of first address lines 70 to be incorporated. The depths of the isolation trenches 165 and of the trenches 30 are preferably the same, that is to say they have been etched into the semiconductor substrate 25 as far as the base substrate 20.

Figure 6A:
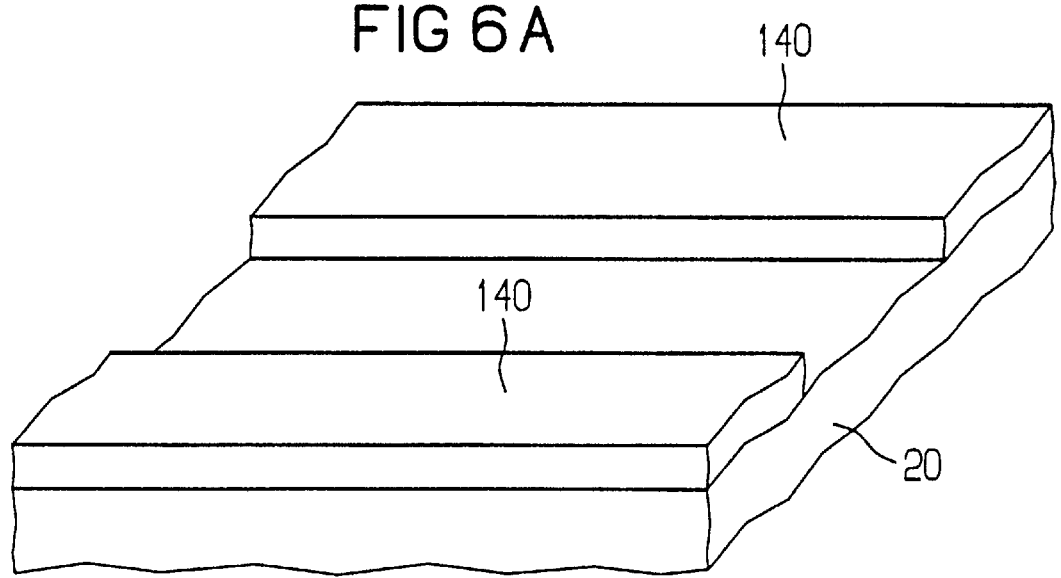
FIGS. 6A–6B are perspective views of a second configuration of the base substrate.
Figure 6B:
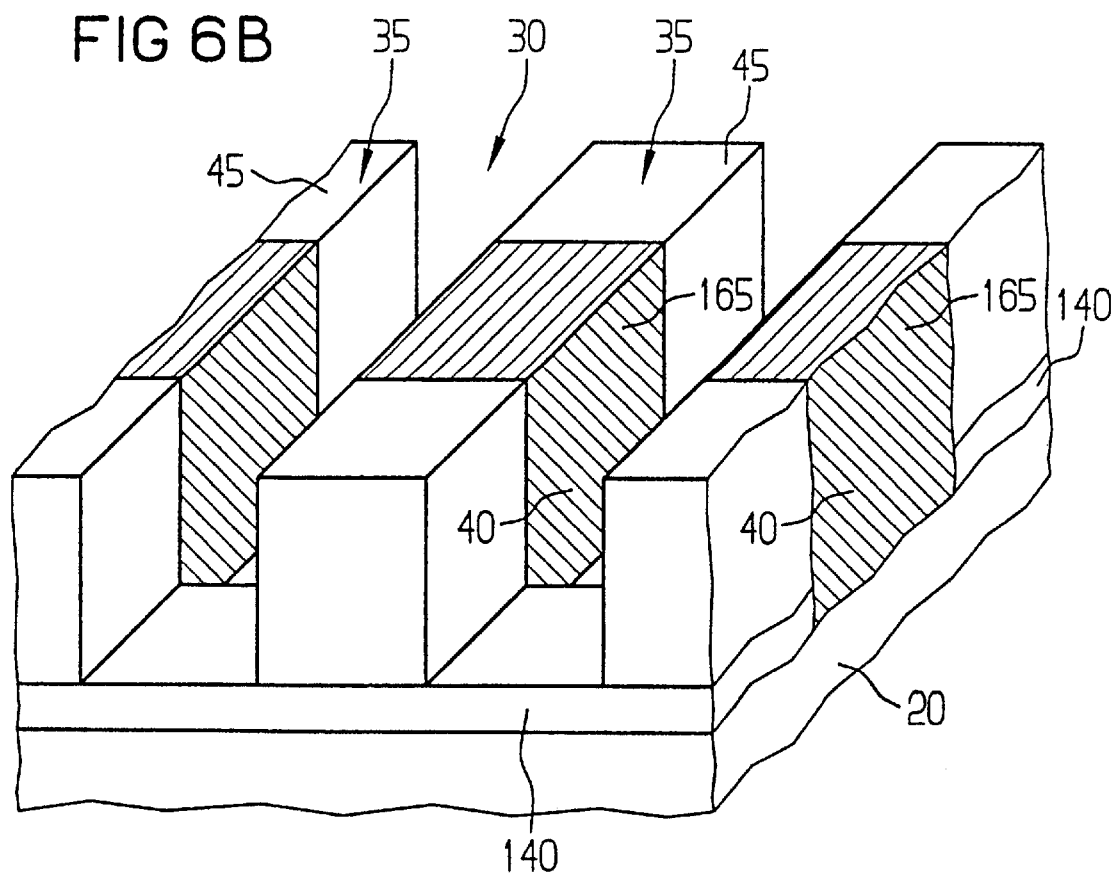

If an insulator is used as the base substrate 20, then the second address lines 140 can also be arranged directly on the lower face 85 of the semiconductor substrate regions 45. This is shown in FIGS. 6A and 6B. For this purpose, the second address lines 140 are applied first of all, in the form of strips, to the base substrate 20. The lateral distance between the individual second address lines 140 and their width in this case already corresponds to the distance from the semiconductor substrate regions 45 to be formed later. The structure width 1 F is preferably used here as well. As already explained above, the isolation trenches 165 and the trenches 30 are then etched in the semiconductor substrate 25.

Second address lines 140 can also be formed in the base substrate 20 using a base substrate 20 composed of a semiconductor material. As an illustration of this, reference should be made to FIGS. 7A and 7B. If, for example, the base substrate 20 is composed of an n-conductive material, then, before the epitaxial application of the p-conductive semiconductor substrate 25, second address lines 140 are incorporated, in the form of strips, in the base substrate 20. These are then preferably p$^+$-doped, that is to say they have a relatively strong concentration of dopants. In the process, a blocking pnp junction 168 is produced between adjacent second address lines 140 which completely isolates the semiconductor substrate regions 45 from one another on their side facing the base substrate 20.

Figure 9:
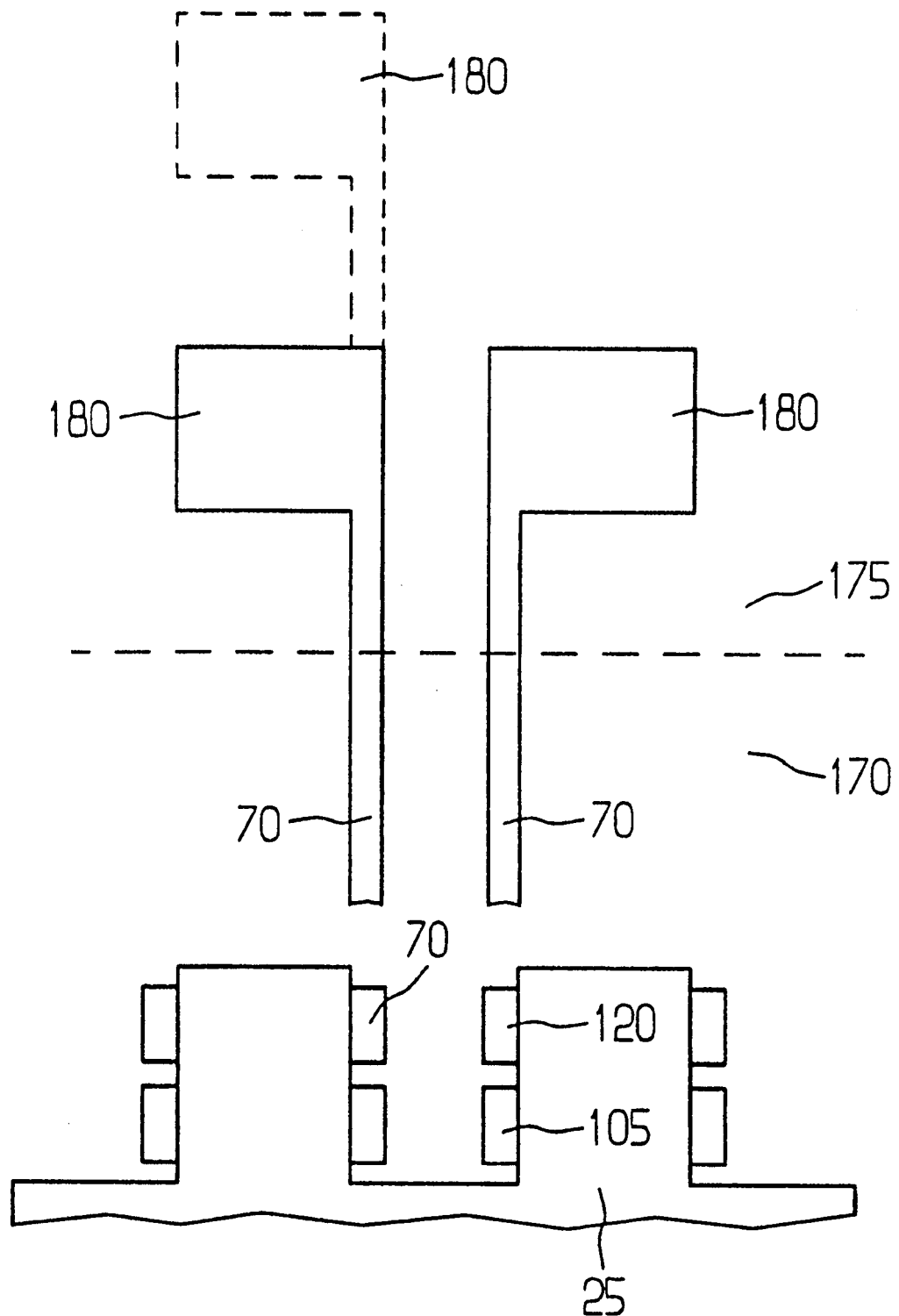
FIG. 9 is a diagrammatic view of another option of making contact with the first address lines.

FIGS. 8 and 9 show how contact is made with the first address lines. The individual memory cells 50 are preferably combined in a memory cell field 170. The first address lines 70, which are partially arranged one above the other and extend as far as the periphery 175 of the memory cell field 170, lead out of this memory cell field 170. There, the individual first address lines 70 are separated, and each end in individual contact regions 180. Since the first address lines 170 have been deposited conformally, first address lines 70 which are adjacent and have been formed at the same time, for example the first lower address lines 105, must be separated from one another by suitable mask techniques. In particular, the address lines 70 running in a common trench 30 have connections to one another at the ends of the trenches 30. Suitable trim masks, which cover those regions of the first address lines which are not to be etched, are used to cut through these connections. In contrast to this, the connecting regions between adjacent first address lines 70 remain uncovered by the trim mask, and are thus removed by a subsequent etching step. The individual contact regions 180 are, in contrast, preferably formed by means of so-called pad masks. These determine the size and position of the contact regions 180.

We claim:

1. An electrically programmable, non-volatile memory cell configuration, comprising:
    a semiconductor substrate of a first conductivity type having a trench with at least one side wall formed therein;
    at least one first address line running along said side wall of said trench in said substrate, and at least one second address line in said substrate crossing said first address line at a spaced distance therefrom;
    a memory cell substantially between said first address line and said second address line at least partially in said semiconductor substrate, said memory cell having at least one first doped region of a second conductivity type forming a direct junction between said first and second conductivity types, said direct junction allowing an electrical current flow between said first address line and said second address line in said semiconductor substrate to be limited unidirectionally; and
    at least one intermediate layer on said semiconductor substrate between said first address line and said second address line forming a part of said memory cell.

2. The memory cell configuration according to claim 1, wherein said first address line is of the second conductivity type and is doped with a dopant of the second conductivity type.

3. The memory cell configuration according to claim 2, wherein said first address line is formed of doped polysilicon having a dopant content of between $10^{20}$/cm3 and $10^{22}$/cm3.

4. The memory cell configuration according to claim 1, wherein said first address line is a self-aligned edge web on said side wall of said trench.

5. The memory cell configuration according to claim 1, wherein said intermediate layer is disposed directly between said first doped region of said memory cell and said first address line on said side wall of said trench.

6. The memory cell configuration according to claim 1, wherein a conductivity of said intermediate layer is changeable by a signal selected from the group consisting of a voltage pulse and a current pulse, for permanently storing a logic value in said memory cell.

7. The memory cell configuration according to claim 1, wherein said intermediate layer is formed of an oxide.

8. The memory cell configuration according to claim 7, wherein said oxide is silicon oxide.

9. The memory cell configuration according to claim 1, wherein:
    said trench is one of a multiplicity of trenches formed in said semiconductor substrate substantially parallel to one another and having webs disposed in between, said trenches have side walls on said webs and at least one first address line runs on each said side wall along said trenches;
    said webs have isolation regions extending transversely to said trenches, said isolation regions divide said webs into individual, mutually isolated, semiconductor substrate regions of the first conductivity type, whereby at least two first doped regions are located in each said semiconductor substrate region and are each associated with a respective memory cell; and
    each said semiconductor substrate region is connected to a respective said second address line running transversely to said first address lines and at a distance therefrom.

10. The memory cell configuration according to claim 9, wherein at least one first lower address line and one first upper address line, located above and separated from said lower address line, are arranged on each side wall of said trenches.

11. The memory cell configuration according to claim 9, wherein each said semiconductor substrate region has at least one second doped region of the first conductivity type, with a conductivity higher than a conductivity of said semiconductor substrate region, for low-resistance connection to said second address line.

12. The memory cell configuration according to claim 9, which comprises a base substrate carrying said semiconductor substrate.

13. The memory cell configuration according to claim 12, which comprises third doped regions of the second conductivity type disposed on a side of said semiconductor substrate regions facing said base substrate, for insulating said semiconductor substrate regions from one another.

14. The memory cell configuration according to claim 12, wherein said second address lines on said base substrate are arranged underneath said semiconductor substrate regions.

15. The memory cell configuration according to claim 9, which comprises an isolating layer filling said trenches and carrying said second address lines.

16. The memory cell configuration according to claim 9, wherein said memory cells are combined in a memory cell field having a periphery, and said first address lines are routed out of said memory cell field to said periphery, and including individual contact regions of said first address line at said periphery.

17. A method of producing an electrically programmable, non-volatile memory cell configuration, which comprises the following steps:
    providing a semiconductor substrate of a first conductivity type;

forming mutually parallel isolation trenches in the semiconductor substrate;

filling the isolation trenches with an insulating material and forming isolation regions in the isolation trenches;

incorporating mutually parallel trenches transversely to the isolation trenches in the semiconductor substrate, retaining webs between the trenches, whereby the webs are subdivided by the isolation regions of the isolation trenches into individual semiconductor substrate regions of the first conductivity type;

forming an intermediate layer on the side walls of the trenches;

applying first address lines of a second conductivity type to the side walls of the trenches, whereby the first address lines contain a dopant of the second conductivity type; and heat-treating the semiconductor substrate at a predetermined diffusion temperature, and partially diffusing the dopant out of the first address lines, through the intermediate layer, and into the semiconductor substrate regions, for forming therein first doped regions of the second conductivity type with a direct junction to the first conductivity type.

18. The method according to claim 17, wherein the applying step comprises forming at least one first lower address line and one first upper address line, above and separated from the lower address line, on each side wall of the trenches.

19. The method according to claim 17, which comprises forming the address lines as self-aligned edge webs.

20. The method according to claim 17, which comprises forming the intermediate layer on each side wall to be self-aligning.

21. The method according to claim 17, wherein the providing step comprises epitaxially growing the semiconductor substrate on a base substrate.

22. The method according to claim 21, which comprises creating third doped regions of the second conductivity type in the base substrate underneath the semiconductor substrate regions.

23. The method according to claim 21, which comprises forming mutually parallel second address lines on the base substrate, the second address lines running transversely to the first address lines.

24. The method according to claim 17, which comprises filling the trenches with an isolating layer with a planarizing effect, and subsequently producing second address lines, transversely to the trenches to make contact with the semiconductor substrate regions.

25. The method according to claim 24, which comprises incorporating a second doped region of the first conductivity type in each semiconductor substrate region prior to the step of producing the second address lines, wherein a conductivity of the second doped region is higher than a conductivity of the semiconductor substrate, and the second doped region forms a low-resistance contact between the semiconductor substrate regions and the second address lines.

26. The method according to claim 17, which comprises combining the memory cells in a memory cell field from which the first address lines are routed out to the periphery of the memory cell field, and separating the first address lines at the periphery with an etching mask.

27. The method according to claim 26, which comprises providing an individual contact region for each first address line on the periphery.

28. The method according to claim 17, which comprises forming the first address lines of in-situ-doped polysilicon having a dopant concentration of $10^{20}/cm^3$ to $10^{22}/cm^3$.

29. The method according to claim 17, which comprises adjusting a diffusion temperature to above 800° C.

* * * * *